(12) United States Patent
Osakabe

(10) Patent No.: US 6,400,280 B1
(45) Date of Patent: Jun. 4, 2002

(54) REMOTE CONTROL SIGNAL RECEIVER AND METHOD, AND REMOTE CONTROL SYSTEM

(75) Inventor: Yoshio Osakabe, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 08/985,711

(22) Filed: Dec. 5, 1997

(30) Foreign Application Priority Data

Dec. 18, 1996 (JP) .............................. 8-338031

(51) Int. Cl.⁷ ................................. H04Q 1/00
(52) U.S. Cl. .............. 340/825.25; 348/734; 340/825.69
(58) Field of Search ............... 340/825.25, 821.27, 340/825.72, 825.69; 348/173, 176, 175, 734; 379/102; 370/447

(56) References Cited

U.S. PATENT DOCUMENTS

| | | | | |
|---|---|---|---|---|
| 4,817,203 A | * | 3/1989 | Tsurumoto | 340/825.69 |
| 4,855,730 A | * | 8/1989 | Venners | 340/825.24 |
| 5,128,667 A | * | 7/1992 | Enomoto et al. | 340/825.72 |
| 5,532,684 A | * | 7/1996 | Katsu | 340/825.25 |
| 5,537,107 A | | 7/1996 | Funado | |
| 5,574,514 A | | 11/1996 | Tanihira et al. | |
| 5,905,442 A | * | 5/1999 | Mosebrook | 340/825.69 |
| 5,949,351 A | * | 9/1999 | Hahm | 340/825.72 |
| 6,005,490 A | * | 12/1999 | Higashihara | 340/825.72 |

FOREIGN PATENT DOCUMENTS

| | | |
|---|---|---|
| EP | 0 582 343 A | 2/1994 |
| EP | 0 604 167 A | 6/1994 |
| EP | 0 612 157 A | 8/1994 |

OTHER PUBLICATIONS

Hoffman and Moore: "IEE 1394: A Ubiquitous Bus" Compcon '95. Digest of Papers, Mar. 5, 1995, San Francisco, CA, USA, pp. 334–338, XP000545446.

* cited by examiner

*Primary Examiner*—Brian Zimmerman
(74) *Attorney, Agent, or Firm*—Frommer Lawrence & Haug LLP; William S. Frommer; Glenn F. Savit

(57) ABSTRACT

A remote control signal for indicating reproduction of DVD 24 which is transmitted from a bi-directional remote commander, is deciphered by a digital TV 21 and then converted to the data format of an IEEE-1394 serial bus 26, and then transmitted to DVD 24. DVD 24 transmits the response to the received remote control signal to the digital TV 21, and also starts the reproduction operation. The reproduced signal is supplied to the digital TV 21 through the IEEE-1394 serial bus 26. The digital TV 21 transmits the signal corresponding to the response from DVD 24 to the bi-directional remote commander 27, and also displays the pictures corresponding to the reproduced signal and output the voices.

3 Claims, 8 Drawing Sheets

REMOTE CONTROL SIGNAL RECEIVER AND METHOD, AND REMOTE CONTROL SYSTEM

BACKGROUND OF THE INVENTION

The present invention relates to remote control signal receiver and method, and a remote control system, and for example relates to remote control signal receiver and method and a remote control system in which a remote control signal can be transmitted among devices connected to a serial bus by converting the remote control signal to a data format of the serial bus for transmitting digital data bi-directionally.

Recently, it has been widely performed to control devices by using a remote commander for transmitting a command with infrared radiation or the like (hereinafter suitably referred to as remote control). FIG. 1 shows the case where plural devices are controlled by using a remote commander. In this case, a television receiver (TV) 4 is operated by a remote controller 1 which is attached to the television receiver. A video cassette recorder (VCR) 5 is operated by a remote controller 2 which is attached thereto. An LD player 6 is operated by a remote controller 3 which is attached thereto.

As described above, when each device is remote-controlled, the remote control attached to each device is used. However, it has been recently typical to attach remote controllers to most domestic electrical articles such as video/acoustic equipment, air conditioners, etc., and thus, the home is flooded with many remote controllers. As a result, there may occur a case where a device is operated by a remote controller, which is different from a remote controller designed for that device, so that the device malfunctions or never operates.

Therefore, as shown in FIG. 2, it may be considered that a remote controller 11 is provided with a function of transmitting remote control signals corresponding to plural devices, and it transmits a remote control signal corresponding to a device specified by a user, whereby the number of remote controllers can be reduced and the malfunction can be suppressed.

However, even when a remote controller is enabled to transmit the remote control signals corresponding to plural devices, devices which are operation targets (in ,this case, TV 4, VCR 5 and LD player 6) must be placed where they can receive the remote control signals from the remote controller 11, and for example there is a problem that it is impossible to control a device in a room from another room.

Further, for example, when a user operates VCR 5 by using the remote controller 11, in order to check whether the VCR 5 correctly performs the operation corresponding to an instruction of the user's remote control, the user must watch the display portion of VCR 5 or check whether a tape actually runs, and this is cumbersome.

SUMMARY OF THE INVENTION

The present invention has been implemented in view of the above situation, and it has an object to moderate the restriction on the placement of each device when each device is operated by using a remote controller for plural devices, and also facilitate a check operation as to whether an operation instructed to each device by using the remote controller is actually performed by the device.

A remote control signal receiver according to a first aspect of the present invention is characterized by including reception means of receiving a remote signal, conversion means for converting the remote control signal to data of data format of a serial bus when the remote control signal is directed to targets other than itself, and transmission means for transmitting the data converted by the conversion means through the serial bus to a device connected to the serial bus.

A remote control signal reception method according to a second aspect of the present invention is characterized by comprising the steps of receiving a remote control signal, converting the received signal to data of data format of a serial bus when the received remote control signal is directed to targets other than itself, and transmitting the converted data through the serial bus to a device connected to the serial bus.

A remote control system according to a third aspect of the present invention which transmits a remote control signal transmitted from a remote control generator among devices which are connected by a serial bus for transmitting digital data bi-directionally, wherein each device includes remote control signal reception means for receiving the remote control signal, conversion means for converting the remote control signal to data of data format of a serial bus when the remote control signal is directed to targets other than itself, transmission means for transmitting the remote control data converted by the conversion means through the serial bus to another prescribed device connected to the serial bus, remote control data reception means for receiving the remote control data from another device, response means for transmitting a response to the remote control data received by the remote control data reception means through the serial bus to another device, response reception means for receiving the response transmitted through the serial bus by response means of another device, and remote control data transmission means for generating the remote control data corresponding to the response received by the response receiving means, and transmitting remote control data to the remote control signal generator.

In the remote control signal receiver according to the first aspect of the present invention, the reception means receives the remote control signal, and when the remote control signal is directed to other targets than itself, the conversion means converts the remote control signal to the data of the data format of the serial bus. The transmission means transmits the data converted by the conversion means through the serial bus to a device connected to the serial bus.

In the remote control signal reception method according to the second aspect of the present invention, the remote control signal is received, and when the received remote control signal is directed to targets other than itself, the remote control signal is converted to the data of the data format of the serial bus. The converted data are transmitted through the serial bus to a device connected to the serial bus.

In the remote control system according to the third aspect of the present invention, in each device, when the remote control signal is directed to targets other than itself, the conversion means converts the remote control signal to the data of the data format of the serial bus, the transmission means transmits the remote control data converted by the conversion means through the serial bus to another prescribed device connected to the serial bus, the remote control data reception means receives remote control data from another device, the response means transmits the response corresponding to the remote control data received by the remote control data through the serial bus to another device, the response reception means receives the response transmitted through the serial bus by the response means of another device, and the remote control data transmission means generates remote control data corresponding to the response received by the response reception means and transmits the data to the remote control signal generator.

DETAILED DESCRIPTION OF THE PREFERRED EMBODIMENTS

Preferred embodiments according to the present invention will be described hereunder with reference to the accompanying drawings.

Before the description on the preferred embodiments according to the present invention, the feature of the present invention will be described hereunder by adding the corresponding embodiments (for example) in parentheses after respective means in order to clarify the relationship between each means of the present invention. described in the Scope of Claim for Patent and the following embodiments.

Figure 5:
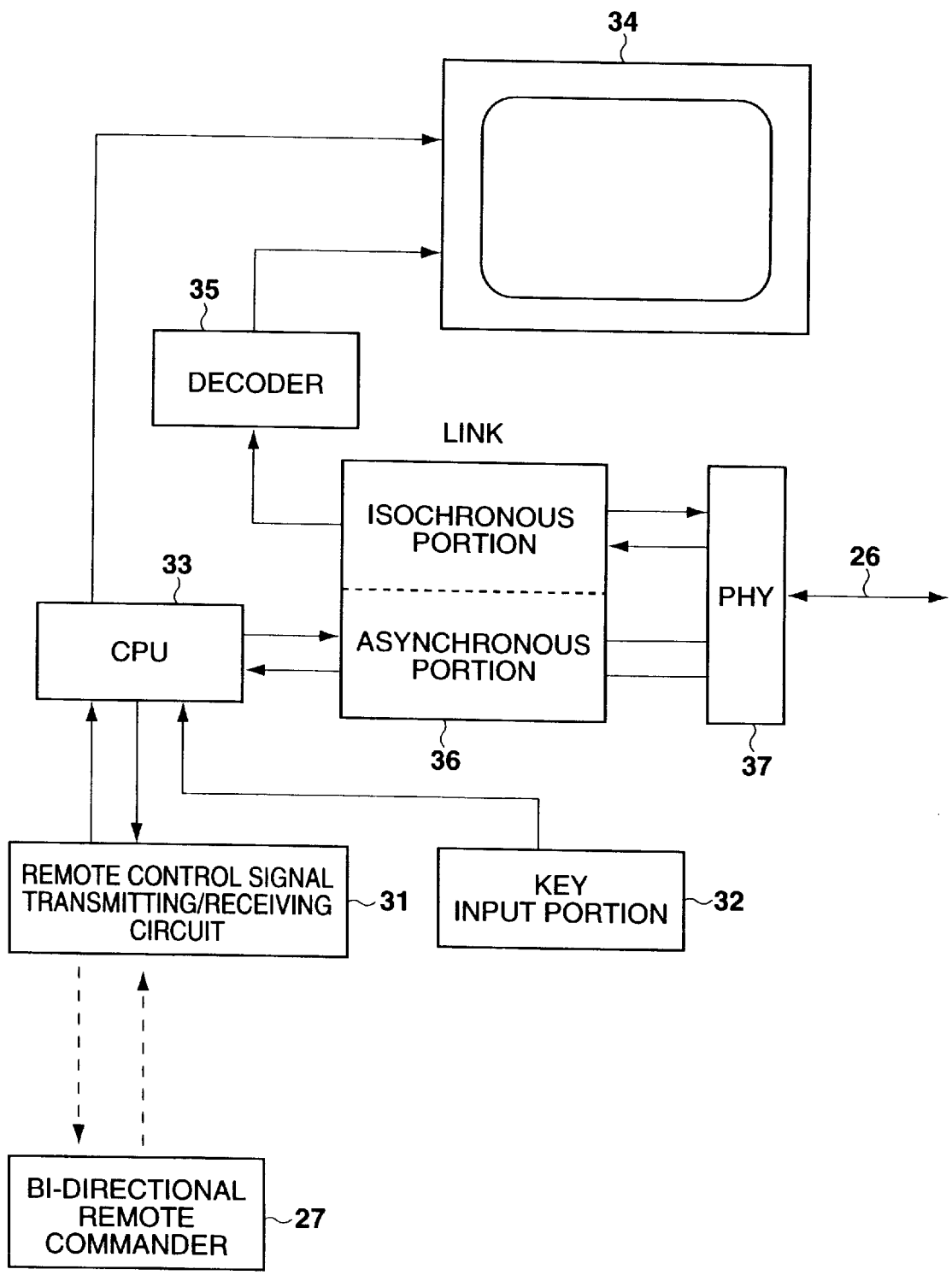
FIG. 5 is a block diagram showing the detailed construction of a digital TV 21 of FIG. 3.

That is, the remote control signal receiver according to the present invention includes reception means (for example, remote control signal transmitting/receiving circuit 31 of FIG. 5) for receiving a remote control signal, conversion means (for example, LINK-IC 36 of FIG. 5) for converting the remote control signal to data of data format of a serial bus when the remote control signal is directed to targets other than itself, and transmission means (for example, PHY-IC 3 of FIG. 5) for transmitting the data converted by the conversion means through the serial bus to a device connected to the serial bus.

The remote control signal receiver further includes reception means (for example, PHY-IC 37 of FIG. 5) for receiving an asynchronous packet returned from a prescribed device which receives the asynchronous packet, and transmission means (for example, remote control signal transmitting/receiving circuit 31 of FIG. 5) for converting the returned asynchronous packet to the remote control signal and transmitting the remote control signal.

In the remote control system according to the present invention, each device includes remote control reception means (for example, remote control signal transmitting/receiving circuit 31 of FIG. 5) for receiving a remote control signal, conversion means (for example, LINK-IC 36 of FIG. 5) for converting the remote control signal to the data of the data format of the serial bus when the remote control signal is directed to targets other than itself, transmission means (for example, PHY-IC 37 of FIG. 5) for transmitting the remote control data converted by the conversion means through the serial bus to another prescribed device connected to the serial bus, remote control data reception means (for example, PHY-IC 37 of FIG. 5) for receiving remote control data from another device, response means (for example, CPU 33 of FIG. 5) for transmitting the response corresponding to the remote control data received by the remote control data reception means through the serial bus to another device, response reception means (for example, PHY-IC 37 of FIG. 5) for receiving the response transmitted through the serial bus by the response means of another device, and remote control data transmission means (for example, remote control signal transmitting/receiving circuit 31 of FIG. 5) for generating the remote control data corresponding to the response received by the response reception means and transmitting the remote control data to the remote control signal generator.

In the remote control system according to the present invention, the remote control signal generator includes reception means (for example, transceiver portion 44 of FIG. 11, transceiver portion 54 of FIG. 12) for receiving the remote control data from the remote control data transmission means.

In the remote control system according to the present invention, the device has a mode in which the remote control signal from the remote control signal generator is received, and a mode in which the remote control signal from the remote control signal generator is not received, and it further includes first restriction means (for example, CPU 33 of FIG. 5) for restricting the number of devices which receive the remote control signal, and second restricting means (for example, CPU 33 of FIG. 5) for restricting the number of devices which transmit the remote control data corresponding to the response to the remote control signal.

In the remote control system according to the present invention, the remote control signal generator includes display means (for example, LCD 42 of FIG. 11) for displaying a symbol corresponding to a control command to be transmitted to a device, selection means (for example, operation key 43 of FIG. 11) for selecting the symbol displayed on the display means, and control command transmission means (for example, transceiver portion 44 of FIG. 11) for transmitting the control command corresponding to the symbol selected by the selection means to a device.

Needless to say, this description does not mean that each means is limited to the above.

Figure 1:
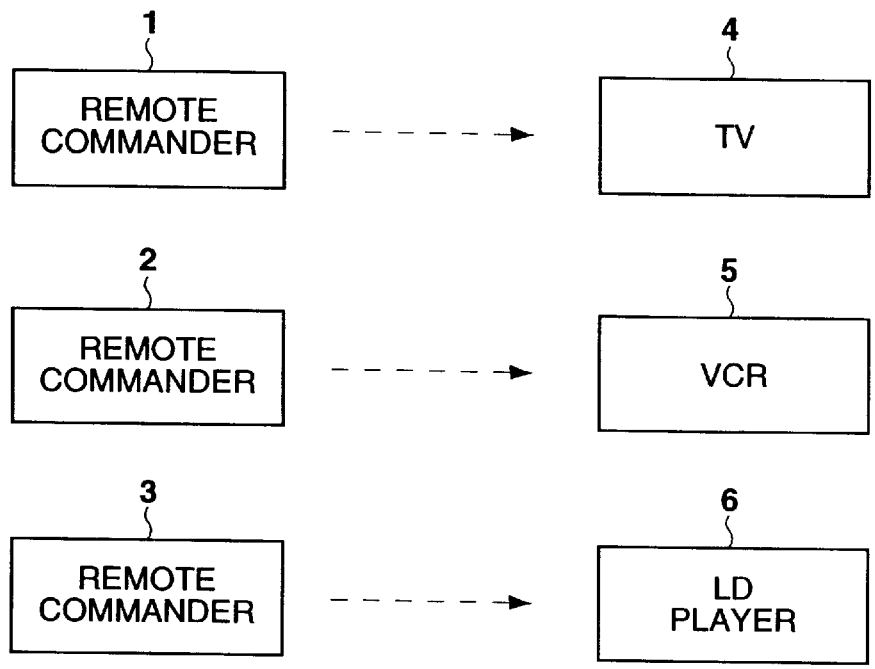
FIG. 1 is a diagram showing a conventional method for controlling devices by using a remote commander.
Figure 2:
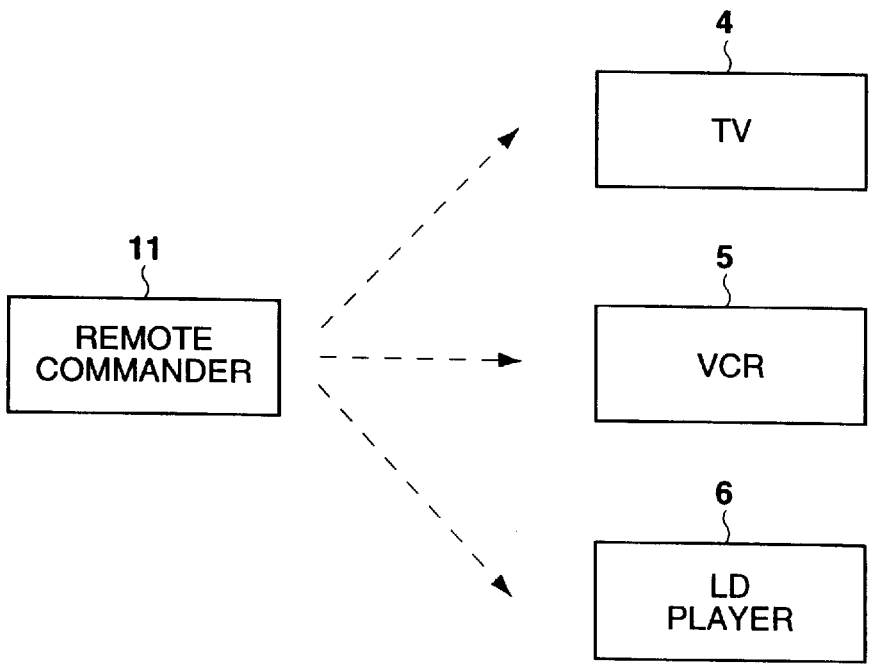
FIG. 2 is a diagram showing a state that plural devices are controlled by using a remote commander.
Figure 3:
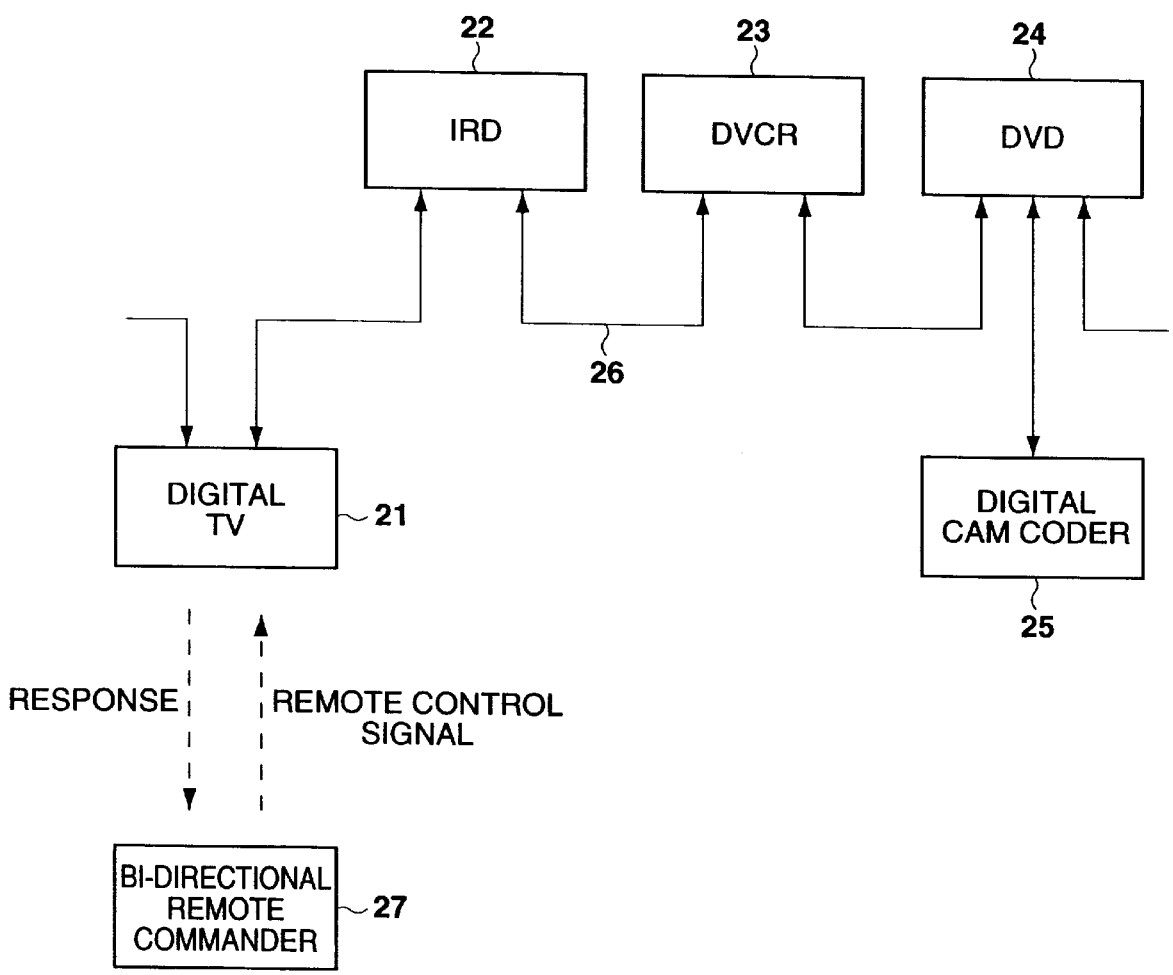
FIG. 3 is a diagram showing the construction of an embodiment of an AV system to which a remote control system of the present invention is applied.

FIG. 3 is a block diagram showing the construction of an embodiment of an AV (audio visual) system to which a remote control system of the present invention is applied. A digital TV 21, an integrated receiver-decoder (IRD: integrated receiver-decoder) 22, DVCR (digital video cassette recorder) 23, DVD (digital versatile disc), a digital camcorder 25 are connected to one another through IEEE (The Institute of Electrical and Electronics Engineers, Inc.)—1394 High Performance Serial Bus (hereinafter referred to as IEEE-1394 serial bus) 26. A bi-directional remote commander 27 transmits a remote control signal corresponding to a predetermined command, and receives a remote control signal corresponding to a response to the control command transmitted from the digital TV 21 or the like.

Next, the operation will be described. The bi-directional remote commander 27 contained in a receiving circuit of the remote control signal transmits the remote control signal corresponding to the predetermined control command to the digital TV 21. The digital TV 21 converts the remote control signal from the bi-directional remote commander 27 to the data format of an asynchronous packet of an IEEE-1394 serial bus.

Here, the IEEE-1394 serial bus which is defined in IEEE will be described. The data transmission of the IEEE-1394 is performed both in an asynchronous data transmission mode (asynchronous mode), and an isochronous data transmission mode (isochronous mode) which is synchronized with an isochronous cycle of 8 KHz (125 $\mu$S) which is generated by a device serving as a cycle master to the bus.

The asynchronous mode is generally used to transmit data in a mode which is not based on real time, and transmit a control signal and a control command of a device. Further, the isochronous mode is used to transmit data which are required to be transmitted on a real-time basis, such as data of moving pictures, audio data such as music, playing of musical instruments, etc.

Figure 4:
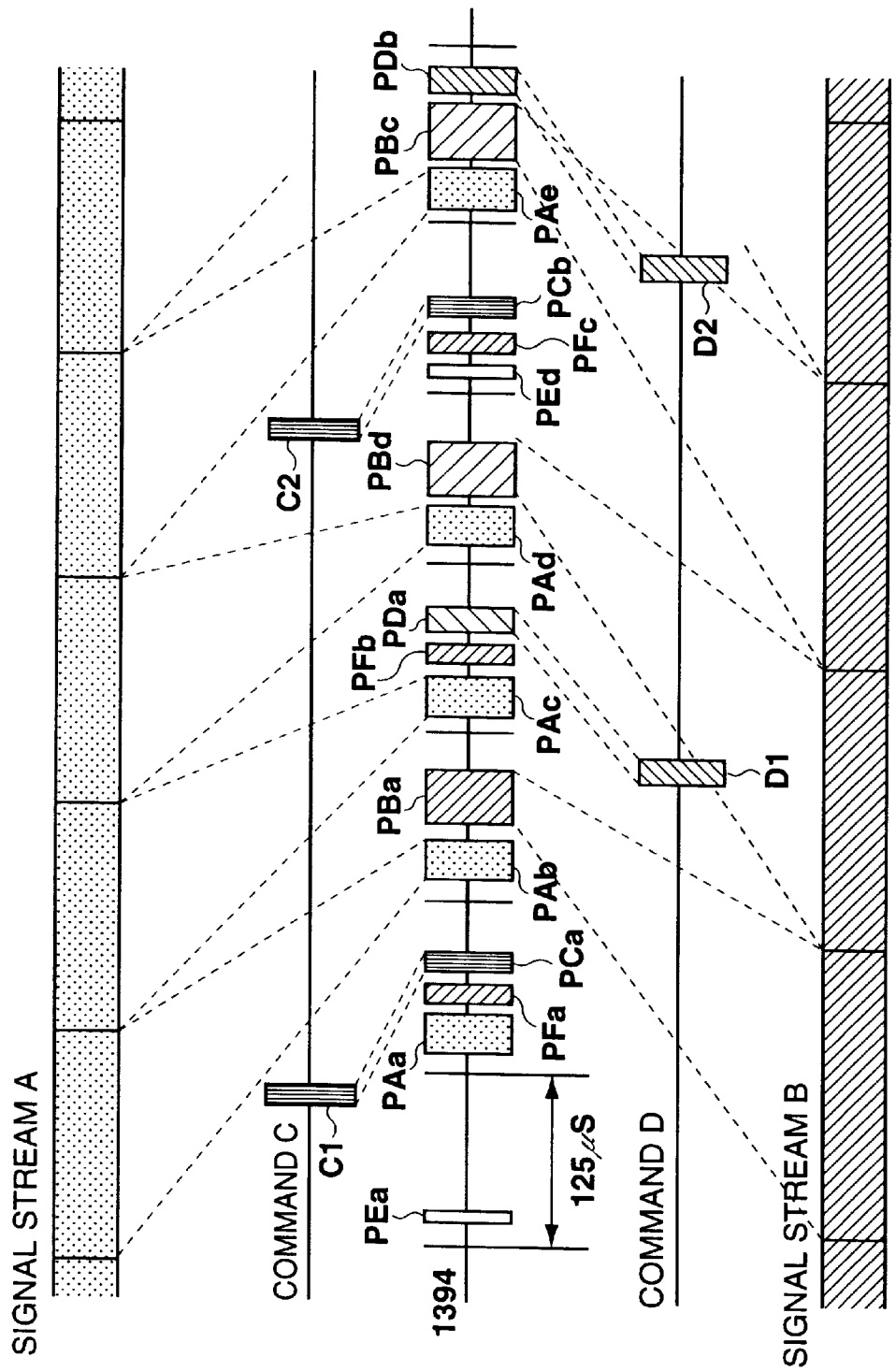
FIG. 4 is a diagram showing a transmission state of isochronous data and asynchronous data.

FIG. 4 shows an aspect in which a signal stream and a control command are multiplexed in the isochronous mode and the asynchronous mode respectively, and then transmitted through the IEEE-1394 serial bus. A signal stream A is transmitted as packets PAa, PAb, PAc, PAd, PAe in the isochronous mode on the IEEE-1394 serial bus. Further, the packets C1, C2 of the command C are transmitted as packets PCa, PCb in the asynchronous mode on the IEEE-1394 serial bus.

Likewise, a signal stream B is transmitted as packets PBa, PBb, PBc in the isochronous mode on the IEEE-1394 serial bus. Further, packets D1, D2 of a command D are transmitted as packets PDa, PDb in the asynchronous mode on the IEEE-1394 serial bus. In the isochronous mode, each packet is transmitted at a cycle of 125 $\mu$S on the IEEE-1394 serial bus. The transmission rate of the IEEE-1394 serial bus may be set to 100 Mbps (megabits/second), 300 Mbps and 400 Mbps.

Each device connected to the IEEE-1394 serial bus can transmit pictures, voice and control commands to other devices at high speed. The transmission distance of the IEEE-1394 serial bus between devices is equal to 4.5 meters at present, however, it may be considered to be increased to 100 meters or more.

As described later, the remote control signal transmitted from the bi-directional remote commander 27 shown in FIG. 3 contains data representing a destination device to which the control command is transmitted. For example, when it contains data indicating the digital camcorder 25, the digital TV 21 which receives the remote control signal from the bi-directional remote commander 27 converts the control command corresponding to the remote control signal to the asynchronous packet of the IEEE-1394 serial bus 26, and transmits it through the IEEE-1394 serial bus 26 to the digital camcorder 25.

The digital camcorder 25 receives the control command which is transmitted as the asynchronous packet through the IEEE-1394 serial bus 26 from the digital TV 21, converts the response to the received control command to the data format of the asynchronous packet of the IEEE-1394 serial bus, and then transmits it through the IEEE-1394 serial bus 26 to the digital TV 21.

The digital TV 21 which receives the response from the digital camcorder 25 transmits the remote control signal corresponding to the received response to the bi-directional remote commander 27. The bi-directional remote commander 27 receives the remote control signal transmitted from the digital TV 21 to display on a display device such as an LCD or the like characters, a figure or an icon which corresponds to the response from the digital camcorder 25.

Next, the detailed construction and operation of the digital TV 21 will be described. FIG. 5 is a block diagram showing the inner construction of the digital TV 21. A remote control signal transmitting/receiving circuit 31 receives the remote control signal corresponding to a predetermined control command from the bi-directional remote commander 27, and transmits the remote control signal corresponding to the response to the bi-directional remote commander 27.

A key input portion 32 is designed to input a control command by carrying out a key operation. A CPU 33 is designed to supply the control command from the remote control signal transmitting/receiving circuit 31 and the control command from the key input portion 32 to LINK-IC 36, and convert the signal supplied from the LINK-IC 36 to the control command and transmit it to the remote control signal transmitting/receiving circuit 31.

The isochronous portion of the LINK-IC 36 converts an input digital signal stream to an isochronous packet and also converts an input isochronous packet to a digital signal stream. A decoder 35 converts a digital signal stream supplied from the isochronous portion of the LINK-IC 36 to video or audio signals, and outputs the signals.

PHY-IC 37 is designed to control the communication with the IEEE-1394 serial bus 26 according to the protocol of the IEEE-1394 serial bus to transmit the isochronous packet supplied from the isochronous portion of the LINK-IC 36 to the IEEE-1394 serial bus 26 and also supply an isochronous packet supplied through the IEEE-1394 serial bus 26 to the isochronous portion of the LINK-IC 36. Further, it is designed to transmit the asynchronous packet supplied from the asynchronous portion of the LINK-IC 36 to the IEEE-1394 serial bus 26 and also supply an asynchronous packet supplied through the IEEE-1394 serial bus 26 to the asynchronous portion of the LINK-IC 36.

The asynchronous portion of the LINK-IC 36 converts a control command supplied from the CPU 33 to an asynchronous packet and also convert an asynchronous packet supplied from the PHY-IC 37 to a digital signal stream.

Next, the operation will be described. The key input portion 32 is operated by a user, and a character array corresponding to an input control command and a remote control signal corresponding to a control command from the bi-directional remote commander 27 which is input to a built-in reception portion of the remote control signal transmitting/receiving circuit 31 are deciphered in the CPU 33. The deciphered control command is supplied to the display 34 to display the corresponding character, figure, icon or the like in accordance with the content thereof, whereby the user can check the indicated control command.

For example, when the digital camcorder 25 connected to the IEEE-1394 serial bus 26 of FIG. 3 is indicated as a transmission destination to transmit a reproducing control command, the CPU 34 converts the control command to the data format of the asynchronous packet of the IEEE-1394 serial bus 26 to indicate the address of the digital camcorder 25 to Destination_ID. The asynchronous portion of the LINK-IC 36 converts the data to an asynchronous packet, and transmits it from the PHY-IC 37 onto the IEEE-1394 serial bus 26. The digital camcorder 25 transmits a response to the control command as an asynchronous packet of the IEEE-1394 serial bus to the digital TV 21, if necessary.

The asynchronous packet corresponding to the response from the digital camcorder 25 which is returned through the IEEE-1394 serial bus 26 is input to the asynchronous portion of the LINK-IC 36 through the PHY-IC 37, converted to a digital signal stream and then supplied to the CPU 33. The CPU 33 converts the digital signal stream to the information corresponding to the response of the digital camcorder 25, and if necessary it generates the corresponding remote control signal and returns it through the remote control signal transmitting/receiving circuit 31 to the bi-directional remote commander 27. Further, if necessary, it supplies the remote control signal to the display 34 to display corresponding characters, figure, icon or the like, whereby a user can recognize whether the digital camcorder 25 normally receives the control command.

On the other hand, the digital camcorder 25 which receives the control command indicating the reproduction starts the reproduction processing, converts reproduced digital video and audio signals to the data format of the isochronous packet, and then transmits the data format through the IEEE-1394 serial bus 26 to the digital TV 21.

The isochronous packet corresponding to the reproduced video/audio signal which is transmitted from the digital camcoder 25 through the IEEE-1394 serial bus 26 to the digital TV 21 is supplied to the isochronous portion of the LINK-IC 36 through PHY-IC 37, and then converted to a digital signal stream. Thereafter, it is supplied to the decoder 35 and subjected to decode processing which corresponds to a system of compressing video or audio signals such as MPEG (Moving Picture Experts Group) 2 or SD (Super Density) format of DVCR, thereby expanding the compressed video data and audio data to be converted to original video signals and audio signals. The original video signals are supplied to the display 34, and displayed. Further, the audio signals are supplied to a speaker or the like, and output.

As described above, the digital TV 21 can transmit a remote control signal directed to a target other than itself to another device connected to the IEEE-1394 serial bus 26. Accordingly, for example, even when the digital camcorder 25 and the digital TV 21 are put in different rooms, the user can control the digital camcorder 25 by using the bi-directional remote commander 27 from the room in which the digital TV 21 is put. Further, under the control of the CPU 33, the digital TV 21 performs the operation corresponding to the remote control signal such as a channel switching operation, a volume adjusting operation or the like.

In general, there are many devices receiving remote controls at home. In the case of FIG. 3, when plural devices receive remote control signals and transmit the data of asynchronous packets onto the IEEE-1394 serial bus 26, the bus is congested to induce erroneous control and erroneous responses. Therefore, a restriction is imposed on the number of devices which are allowed to convert a remote control signal to the format of the asynchronous packet of the IEEE-1394 serial bus after it receives the remote control signal, and transmit it onto the IEEE-1394 serial bus 26. The CPU provided to each device is allowed to perform the above processing.

Further, remote control signals to a response are returned from plural devices, it is difficult for the bi-directional remote commander 27 to receive these remote control signals. Therefore, a restriction is imposed on the number of devices which are allowed to return the data corresponding to the response onto the IEEE-1394 serial bus 26. The CPU provided to each device is also allowed to perform this processing. Accordingly, the congestion of the bus can be suppressed.

Next, a method of putting the remote control signal on the asynchronous packet of the IEEE-1394 serial bus will be described. Devices connected to the IEEE-1394 serial bus are controlled by a function control protocol (FCP). FCP transmits a response as a control command with an asynchronous packet.

Figure 6:
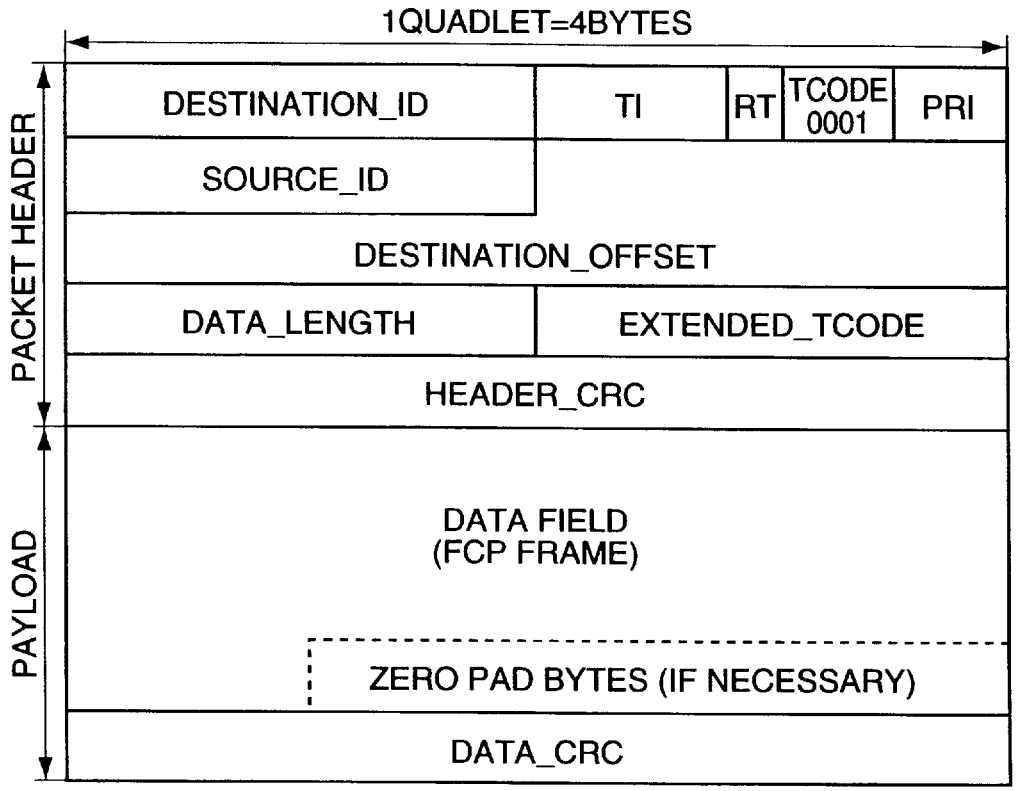
FIG. 6 is a diagram showing the construction of Write request for data block packet in an asynchronous data transmission mode of IEEE-1394 serial bus.
Figure 7:
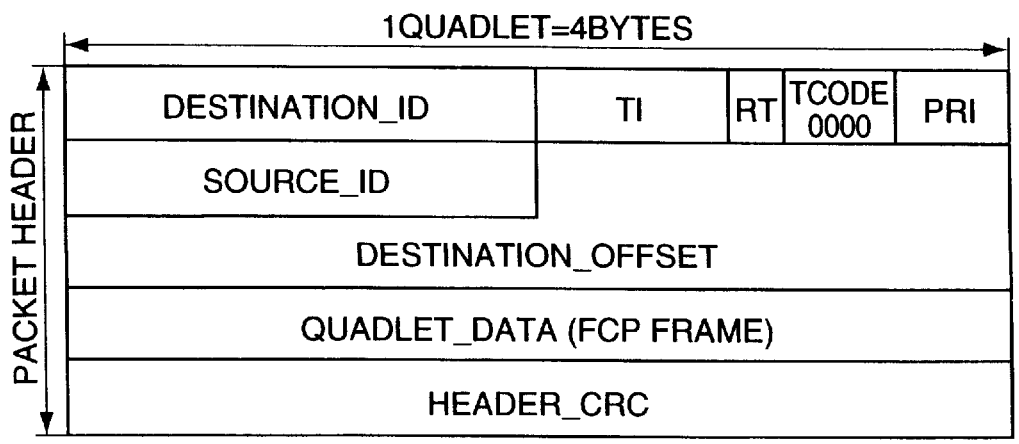
FIG. 7 is a diagram showing the construction of Write request for data quadlet packet in an asynchronous data transmission mode of IEEE-1394 serial bus.

FIG. 6 shows the construction of Write request for data block packet of the asynchronous data transmission mode of the IEEE-1394 serial bus. FIG. 7 shows the construction of Write request for quadlet packet.

In FIG. 6, in Destination_ID is set an address of a packet transmission destination. In TL (transaction label) is set a label for discriminating plural transactions from one another when the plural transactions are issued. In Rt (retry code) is set a code for indicating how to retry when the issuance of a transaction fails. In tcode is set the type of a transaction. In Pri (priority) is set a priority of a transaction. In Destination_offset is set the address of a register corresponding to a FCP frame as described later. In Data_length is set data length, and in Extended_code is set expanded tcode. Further, In Header_CRC (Cyclic Redundancy Check: cyclic redundancy code) is set a cyclic redundancy code for performing an error correction control of the Header portion.

In FIG. 7, tcode in the header portion of the packet of FIG. 6 is set to 0000, and Quadlet_data is set as an FCP frame in the Data_length and Extended_tcode portions. When tcode is set to 0000, Extended_tcode is unnecessary. The other portions are the same as the case of FIG. 6, and thus the description thereof is omitted.

The payload of these two types of packets is called as FCP frame. When the length of the FCP frame is equal to 4 bytes, "Write request for data quadlet" packet as shown in FIG. 7 is used. Source_ID is a transmission side address, and Destination_ID is a reception side address. For example, when the control command is transmitted in the asynchronous data mode of the IEEE-1394 serial bus from the digital TV 21 to the digital camcorder 25 in FIG. 3, the address (node_ID) of the digital TV is indicated to Source_ID, and the address of the digital camcorder 25 is indicated to Destination_ID.

In FIG. 6, Zero pad bytes in the FCP frame is a dummy data which is inserted so that the data length of the FCP frame is an integer of 4 bytes. In Data_CRC is set a cyclic redundancy code for performing the error correction control of the FCP frame.

Figure 8:
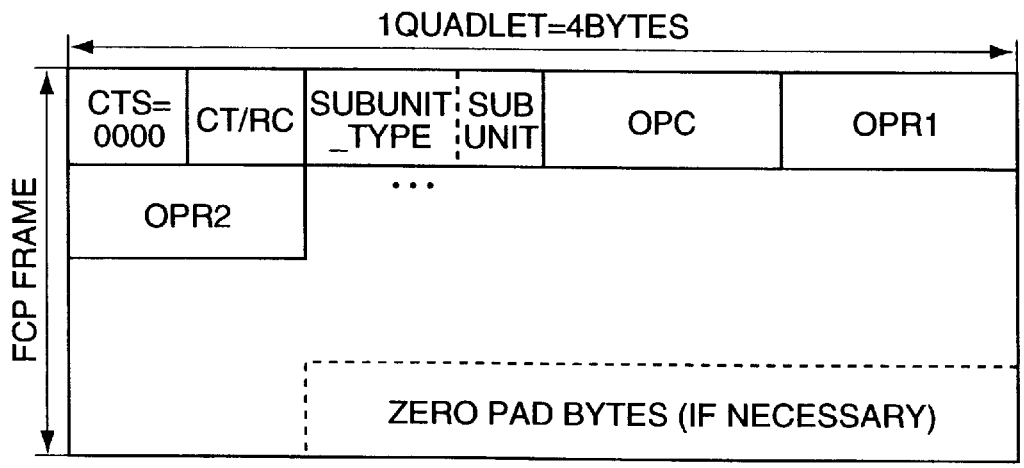
FIG. 8 is a diagram showing the construction of FCP frame in the asynchronous data transmission mode of IEEE-1394 serial bus.

FIG. 8 shows the construction of the FCP frame of the asynchronous data mode of the IEEE-1394 serial bus. Four bits at the head of the FCP frame correspond to a command transaction set (CTS: command transaction set), and CTS= 0000b (hereinafter b represents that a numeral before b is a binary numeral. In this case, 0000 is a binary number) is allocated for AV/C (Audio Visual/control) equipment.

Next 4 bits of CTS (CT(command Type)/RC (Response Code)) is a command type (hereinafter abbreviated as ctype). ctype represents the types of a command and a response, and when MSB of 4 bits is equal to zero, the FCP frame thereof represents a command frame. When MSB of 4 bits is equal to 1, it indicates a response frame.

ctype is allocated as follows:
0000b =CONTROL
0001b =STATUS
0010b =INQUIRY
0011b =NOTIFY
1000b =NOT IMPLEMENTED
1001b =ACCEPTED
1010b =REJECTED
1011b =IN TRANSITION
1100b =IMPLEMENTED/STABLE
1101b =CHANGED Subsequent 5-bit subunit_type is allocated as follows:
00000b =Video monitor
00100b =VCR
00101b =TV tuner
00111b =Video camera When all of 5 bits of subunit_type are equal to 1, subsequent 8 bits represent expanded subunit.

Subsequent 3-bit subunit_number is used to discriminate two decks from each other when plural sub units are provided to one device like a double cassette deck.

8-bit OPC (operation code) is allocated as follows. Here, h represents that a numeral before h is a hexadecimal number.

Figure 9:
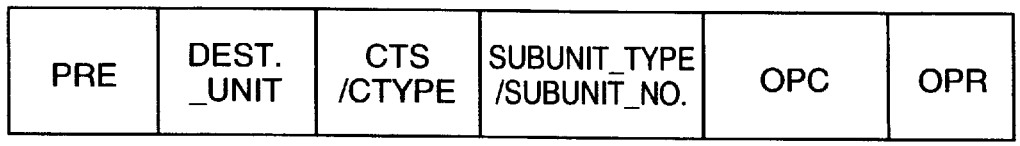
FIG. 9 is a diagram showing the construction of a remote control signal transmitted from a remote commander to a device.

00h to 0Fh command of unit and sub unit
10h to 3Fh command of unit
40h to 7Fh command of sub unit
A0h to BFh command of unit
C0h to DFh command of sub unit FIG. 9 shows an example of the format of a remote control signal when a control command is transmitted from the bi-directional commander to a device connected to the IEEE-1394 serial bus. In this case, it is assumed that in the remote control system shown in FIG. 3 a control command instructing the digital camcorder 25 to perform the reproduction is transmitted from the bi-directional remote commander 27 to the digital camcorder 25. At this time, the following data are set in each field.

(1) PRE: preamble
(2) Dest._unit address corresponding to digital camcorder 25
(3) CTS: CTS =0000b
(4) CTYPE: control =0000b
(5) subunit_type : VCR =00100b
(6) subunit_no. : no. =000b (for single deck)
(7) OPC: PLAY =C3h
(8) OPR: FORWARD =75h The above data are received by the remote control signal transmitting/receiving circuit 31 of the digital TV 21, and in the CPU 33 and the LINK-IC 36, the data are converted to the asynchronous packet as shown in FIG. 4, and then transmitted.through the IEEE-1394 serial bus 26 to the digital camcorder 25.

Figure 10:
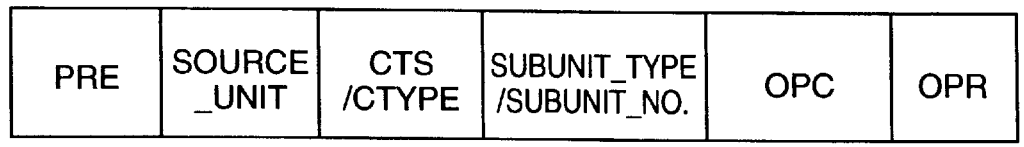
FIG. 10 is a diagram showing the construction of a remote control signal transmitted from a device to a remote commander.

FIG. 10 shows an example of the format of the remote control signal when a response is returned from a device connected to the IEEE-1394 serial bus 26 to the bi-directional remote commander 27 In this case, it is assumed that in the remote control system of FIG. 3, the digital camcorder 25 receives a command, a response of ACCEPTED indicating reception of execution of the command is returned to the digital TV 21, and the response is returned from the digital TV 21 to the bi-directional remote commander 27. At this time, the following data are set in each field.

(1) PRE: preamble
(2) Source_unit: address corresponding to digital camcorder 25
(3) CTS: CTS =0000b
(4) CTYPE: ACCEPTED =1001b
(5) subunit_type: VCR =00100b
(6) subunit_no.: no. =000b (for single deck)
(7) OPC: PLAY =C3h
(8) OPR: FORWARD =75h As a method of transmitting the control command there is considered a method of directly transmitting a control command indicating the reproduction to the digital camcorder 25, a method of displaying characters, a figure, an icon or the icon which represents the type of the control on the frame of the display 34 and operating the bi-directional remote commander 27 or the key provided on the panel of each device to select the characters, the figure, the icon or the like which corresponds to the control desired by the user, whereby the user selects the desired control, etc.

Figure 11:
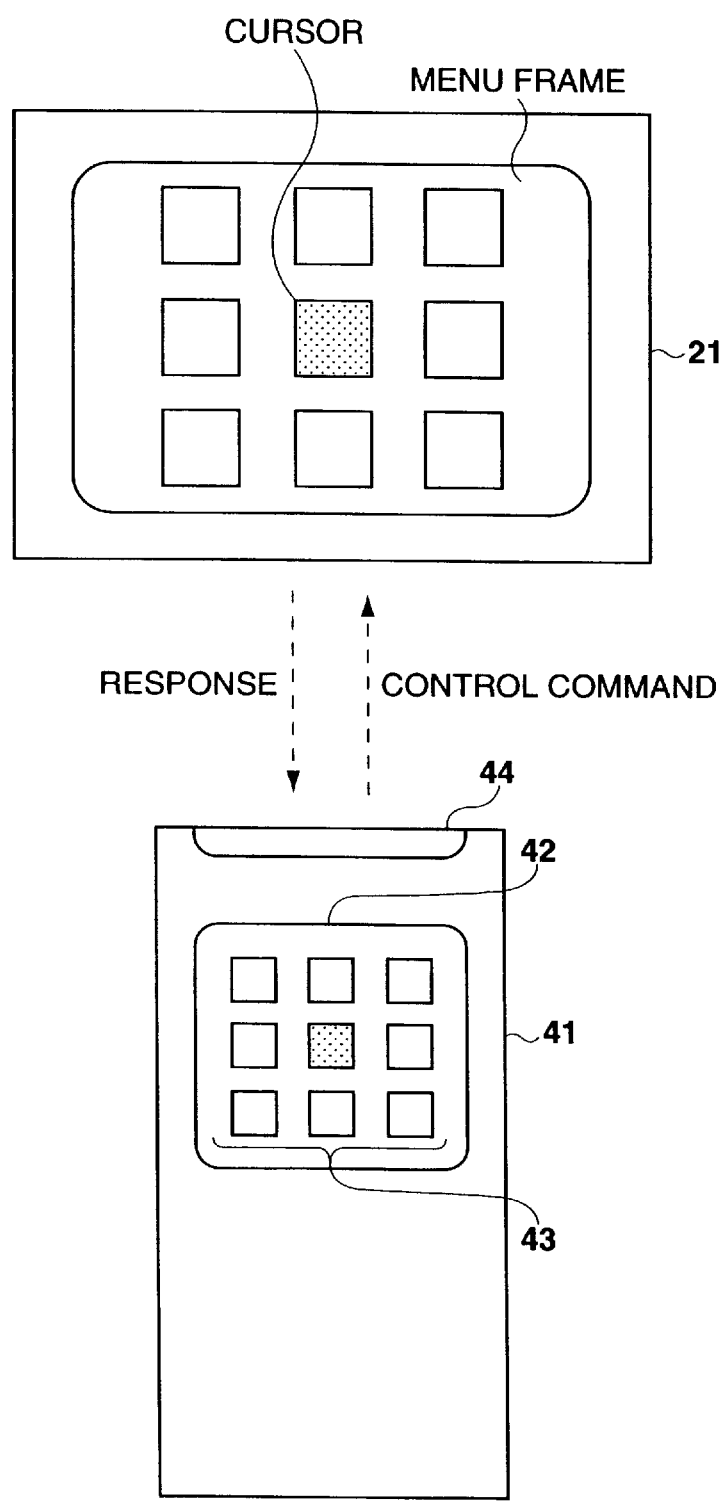
FIG. 11 is a diagram showing a state that an icon corresponding to a control command of a remote commander displayed on the screen of a digital TV is selected by using a key corresponding to the control command displayed on the screen of an LCD of the remote commander.

FIG. 11 shows a case where icons corresponding to nine types of controls are displayed on the frame of the display 34 of the digital TV 21, for example, and the icon corresponding to a desired control is selected by pushing a corresponding one of nine operation keys 43 provided on the remote commander 27. In this case, a display device such as an LCD 42 or the like is provided to the remote commander 41, and the nine operation keys 43 are displayed with characters, figures, icons or the like on the screen thereof.

A transparent touch tablet is provided to the LCD 42, and a user can watch the screen of the LCD 42 through the touch tablet. Accordingly, By pushing a touch tablet corresponding to a portion at which a desired operation key is displayed on the LCD 42, the remote commander 41 recognizes which operation key 43 is selected, and transmits the corresponding control command to the digital TV 21. At this time, for example, the control being selected is clarified to the user by displaying a cursor at the position corresponding to the pushed key.

When the digital TV 21 receives the control command which is transmitted with infrared radiation or the like from a transceiver portion 44 of the remote commander 41, it returns a response indicating the reception. When receiving the response from the digital TV 21, the remote commander 41 directly displays the frame displayed on the LCD 42. When it does not receive any response from the digital TV 21 within a predetermined time, it is judged that the digital TV 21 received no control command from the remote commander 41 or no control command was transmitted to a device to be controlled, and thus the display of the LCD 42 is returned to the state before the operation. Accordingly, the user can check it on the basis of the screen of the LCD 42 of the remote commander 41 at the user side whether the control command is normally transmitted to another device connected to the IEEE-1394 serial bus 26 through the digital TV 21.

Figure 12:
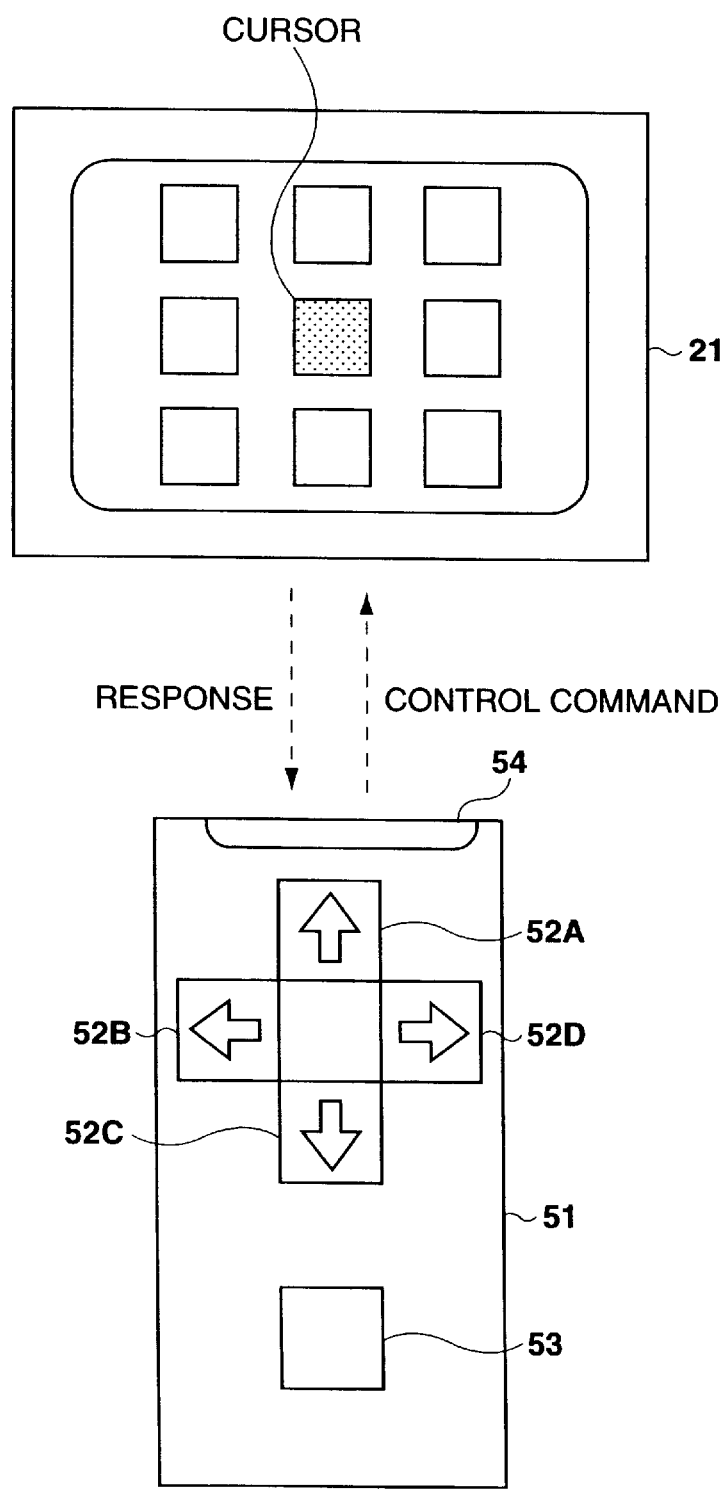
FIG. 12 is a diagram showing a state that an icon corresponding to a control command of a remote commander 51 displayed on the screen of a digital TV 21 is selected by an arrow key provided to the remote commander.

FIG. 12 is a diagram showing a method of selecting the icons corresponding to plural controls displayed on the screen of the display 34 of the digital TV 21 by using the remote commander 51 having four arrows. In this case, a cursor is first displayed on the center icon, for example.

The cursor displayed on the screen of the display 34 is moved upwardly, downwardly, rightwardly and leftwardly by operating four arrow keys 52A to 52D to select the icon corresponding to a desired control. Subsequently, by pushing a check key 53, the selection of the control corresponding to the selected icon is settled. In response to this, the remote control signal corresponding to the control command to select the desired control is transmitted from the transceiver portion 54 of the remote commander 51 to the digital TV 21. The control command corresponding to the remote control signal which is received by the digital TV 21 is transmitted through the IEEE-1394 serial bus 26 to the device corresponding to a desired control which is selected by the user, and the selected control is performed.

For example, it is assumed that a fifth language "Japanese" is selected from nine reproduction languages when DVD 24 is reproduced, the remote control signal transmitted from the transceiver portion 44 of the bi-directional remote control commander 41 to the digital TV 21 is set as follows, for example.

(1) PRE: preamble
 (2) Dest._unit: address corresponding to digital TV 21
 (3) CTS: CTS =0000b
 (4) CTYPE: control =0000b
 (5) subunit_type: video monitor =00000b
 (6) subunit_no.: no. =00b (for single deck)
 (7) OPC: SELECT =08h
 (8) OPR: "5"=35h.

The digital TV 21 which receives the remote control signal transmits a command for indicating the selection of "Japanese" through the IEEE-1394 serial bus 26 to the DVD 24 while the command is carried on an asynchronous packet. Upon receiving the command from the digital TV 21 through the IEEE-1394 serial bus 26, the DVD 24 receives the command for indicating the selection of "Japanese", and returns a response of ACCEPTED for indicating the reception of the execution of the command through the IEEE-1394 serial bus 26 to the digital TV 21 while the response is carried on an asynchronous packet.

The digital TV 21 which receives the response "ACCEPTED" from the DVD 24 returns the following remote control signal to the bi-directional remote commander 41.

(1) PRE: preamble
 (2) Source_unit: address corresponding to digital TV
 (3) CTS: CTS =0000b
 (4) CTYPE: ACCEPTED =1001b
 (5) subunit_type: Video monitor =00000b
 (6) subunit_no.: no. =000b
 (7) OPC: SELECT =08h
 (8) OPR: "5"=35h.

The remote control commander 41 which receives the remote control signal corresponding to the response from the digital TV 21 displays on the screen of the LCD 42 the characters, the figure, the icon or the like which corresponds to the response. Therefore, by merely watching the display frame of the remote commander at the user side, the user can check the response from a device to which the control command is transmitted, and simply know whether the device operates normally.

As described above, in the above embodiment, between the respective devices connected to the serial bus for performing bi-directional transmission of digital data such s the IEEE-1394 serial bus, a remote control signal is transmitted from a remote commander received by a prescribed device to another device to reduce the number of remote commanders in a house and enable free selection of places or rooms in which the devices are put can be freely selected.

Further, the response from the device connected to the serial bus for transmitting the digital data bi-directionally is returned to the remote commander, whereby the characters, figure, icon or the like which corresponds to the response can be displayed on the display frame of the LCD or the like which is provided to the remote commander. Accordingly, the user can check by the remote commander at the user side whether the control instructed by using the remote commander is correctly performed.

Further, software which is operated in devices which are connected to the serial bus for transmitting the digital data bi-directionally and transmit or receive the remote control signal can be simplified by integrating the format of the command of the serial bus for transmitting the digital data bi-directionally and the format of the remote control signal with each other.

In the above embodiment, it is described that the digital TV 21 has a function of receiving the control command transmitted from the remote commander 27, 41, 51 and transmitting it to another device which is connected to the IEEE-1394 serial bus. However, the other devices may be designed to have the same function.

According to the remote control signal receiver and the remote control signal reception method of the present invention, when the received remote control signal is directed to targets other than itself, the remote control signal is converted to the data of the data format of the serial bus, and the converted data are transmitted through the serial bus to a device connected to the serial bus. Therefore, the number of remote commanders can be reduced, and the mount places of the devices which are controlled by the remote commanders and connected through the serial bus to one another can be freely selected.

According to the remote control system of the present invention, in each device, the conversion means converts a remote control signal to remote control data of the data format of the serial bus when the remote control signal received by the remote control signal reception means is directed to targets other than itself, the transmission means transmits the remote control data through the serial bus to another device connected to the serial bus, the response reception means receives a response transmitted through the serial bus from the response means of the other device, and the remote control data transmission means generates the remote control data corresponding to the response received by the response reception means and transmits the data to the remote control signal generator. Therefore, the number of remote control signal generators can be reduced, and the mount places of the devices which are controlled by the remote control signal generators and connected to one another through the serial bus can be freely selected. Further, the operation status of each device can be checked by the remote control signal generator at the user side.

What is claimed is:

1. A remote control system for transmitting a remote control signal transmitted from a remote control signal generator among devices which are connected to one another through a serial bus for transmitting digital data bi-directionally, wherein each device includes:

remote control signal reception means for receiving the remote control signal;

conversion means for converting the remote control signal to remote control data in the data format of said serial bus;

transmission means for transmitting the remote control data converted by said conversion means through said serial bus to another prescribed device of said devices which are connected to said serial bus;

remote control data reception means for receiving the remote control data from said other device;

response means for transmitting a response to the remote control data received by said remote control data reception means through said serial bus to said other device;

response reception means for receiving the response which is transmitted through said serial bus by said response means of said other device; and remote control data transmitting means for generating remote control data corresponding to the response received by said response reception means and transmitting the remote control data to said remote control signal generator;

wherein at least one of said devices has a mode in which the remote control signal from said remote control signal generator is received and a mode in which the remote control signal from said remote control signal generator is not received, and said at least one device further includes:

first restricting means for restricting the number of said devices for receiving the remote control signal; and second restricting means for restricting the number of said devices for transmitting the remote control data corresponding to the response to the remote control signal.

2. Apparatus for use in a system including a serial data bus connected to said apparatus and to a plurality of devices, said apparatus comprising:

first reception means for receiving a remote control signal from a remote control device;

determining means for determining if the remote control signal is intended for said apparatus, and for determining if the remote control signal is intended for at least one of said devices connected to said serial bus;

conversion means for converting the remote control signal to data in the data format of the serial bus when the determining means determines the remote control signal is intended for said at least one device;

transmission means for transmitting the data converted by said conversion means through said serial bus to said at least one device;

restricting means for restricting the number of said devices connected to said serial bus that are allowed to convert said remote control signal to data for transmission on said serial bus, and for restricting the number of devices that are allowed to return a response to the transmitted data on the serial bus;

second reception means for receiving a response to the transmitted data from said at least one device, the response being received over the serial bus; and wireless transmission means for wirelessly transmitting a response to the remote control signal corresponding to the response received from the at least one device, to the remote control device.

3. A remote control signal receiving/transmitting method comprising the steps of:

receiving, by a remote control receiver, a remote control signal from a remote control device, said remote control receiver being associated with a first device that is connected to a serial bus to which a plurality of devices are connected;

determining if the remote control signal is intended for said first device, and determining if the remote control. signal is intended for at least a second device connected to the serial bus;

converting the remote control signal to data in the data format of the serial bus when it is determined that the remote control signal is intended for the second device;

transmitting the converted data through said serial bus to the second device;

restricting, by said first device, the number of said devices connected to said serial bus that are allowed to convert said remote control signal to a packet for transmission on said serial bus;

restricting, by said first device, the number of devices that are allowed to return a response to the transmitted data on the serial bus;

receiving over said serial bus, by said receiver from said second device, a response to the transmitted data; and wirelessly transmitting a response to the remote control signal corresponding to the response received from the second device, to the remote control device.

* * * * *